United States Patent
Svensson et al.

(10) Patent No.: US 9,166,106 B2
(45) Date of Patent: Oct. 20, 2015

(54) NANOWIRE SIZED OPTO-ELECTRONIC STRUCTURE AND METHOD FOR MODIFYING SELECTED PORTIONS OF SAME

(71) Applicant: Glo AB, Lund (SE)

(72) Inventors: Carl Patrik Theodor Svensson, Palo Alto, CA (US); Nathan Gardner, Sunnyvale, CA (US)

(73) Assignee: GLO AB, Lund (SE)

( * ) Notice: Subject to any disclaimer, the term of this patent is extended or adjusted under 35 U.S.C. 154(b) by 24 days.

(21) Appl. No.: 14/059,950

(22) Filed: Oct. 22, 2013

(65) Prior Publication Data

US 2014/0138620 A1    May 22, 2014

Related U.S. Application Data

(60) Provisional application No. 61/719,133, filed on Oct. 26, 2012.

(51) Int. Cl.
| H01L 21/00 | (2006.01) |
| H01L 33/24 | (2010.01) |
| H01L 33/00 | (2010.01) |
| H01L 33/16 | (2010.01) |
| H01L 21/02 | (2006.01) |

(Continued)

(52) U.S. Cl.
CPC ............ *H01L 33/24* (2013.01); *H01L 21/0237* (2013.01); *H01L 21/0254* (2013.01); *H01L 21/02439* (2013.01); *H01L 21/02458* (2013.01); *H01L 21/02505* (2013.01); *H01L 21/02513* (2013.01); *H01L 21/02521* (2013.01); *H01L 21/02603* (2013.01); *H01L 21/02639* (2013.01); *H01L 33/007* (2013.01); *H01L 33/16* (2013.01); *B82Y 20/00* (2013.01); *H01L 33/08* (2013.01)

(58) Field of Classification Search
CPC .............................. H01L 33/24; H01L 33/06
USPC ................................................ 257/13; 438/47
See application file for complete search history.

(56) References Cited

U.S. PATENT DOCUMENTS

| 7,335,908 B2 | 2/2008 | Samuelson et al. |
| 7,396,696 B2 | 7/2008 | Kim et al. |
| 7,829,443 B2 | 11/2010 | Seifert et al. |

(Continued)

FOREIGN PATENT DOCUMENTS

| JP | 2009147140 | 7/2009 |
| KR | 1020100080094 A | 7/2010 |

(Continued)

OTHER PUBLICATIONS

U.S. Appl. No. 61/719,108 entitled "Nanowire LED Structure and Method for Manufacturing the Same,", filed Oct. 26, 2012.

(Continued)

*Primary Examiner* — Matthew Landau
*Assistant Examiner* — Igwe U Anya
(74) *Attorney, Agent, or Firm* — The Marbury Law Group PLLC

(57) ABSTRACT

A LED structure includes a support and a plurality of nanowires located on the support, where each nanowire includes a tip and a sidewall. A method of making the LED structure includes reducing or eliminating the conductivity of the tips of the nanowires compared to the conductivity of the sidewalls during or after creation of the nanowires.

16 Claims, 14 Drawing Sheets

(51) Int. Cl.
*B82Y 20/00* (2011.01)
*H01L 33/08* (2010.01)

(56) References Cited

U.S. PATENT DOCUMENTS

| | | | |
|---|---|---|---|
| 8,350,249 | B1 | 1/2013 | Svensson |
| 2002/0076846 | A1* | 6/2002 | Ihm .................................. 438/34 |
| 2009/0169828 | A1* | 7/2009 | Hersee et al. ................. 428/172 |
| 2010/0283064 | A1* | 11/2010 | Samuelson et al. ............. 257/88 |
| 2011/0079766 | A1 | 4/2011 | Wildeson et al. |
| 2011/0083728 | A1* | 4/2011 | Street et al. ................... 136/255 |
| 2011/0163292 | A1 | 7/2011 | Wang et al. |
| 2011/0254034 | A1 | 10/2011 | Konsek et al. |
| 2011/0254043 | A1* | 10/2011 | Negishi et al. .................. 257/99 |
| 2011/0309382 | A1* | 12/2011 | Lowgren ......................... 257/88 |
| 2011/0310920 | A1* | 12/2011 | Lee et al. .................... 372/45.01 |
| 2012/0211727 | A1 | 8/2012 | Ohlsson et al. |
| 2013/0075693 | A1* | 3/2013 | Svensson et al. ............... 257/13 |
| 2013/0221322 | A1 | 8/2013 | Ohlsson |
| 2014/0077220 | A1* | 3/2014 | Kryliouk et al. ................ 257/76 |

FOREIGN PATENT DOCUMENTS

| | | |
|---|---|---|
| KR | 1020110105641 | 9/2011 |
| KR | 1020120092091 A | 8/2012 |
| WO | WO 2007/102781 A1 | 9/2007 |
| WO | WO2008/048704 A2 | 4/2008 |
| WO | WO 2010/014032 A1 | 2/2010 |
| WO | WO 2011/160051 | 12/2011 |
| WO | WO2012/050888 A2 | 4/2012 |
| WO | WO 2013/025874 | 2/2013 |

OTHER PUBLICATIONS

U.S. Appl. No. 14/059,629, entitled "Nanowire LED Structure and Method for Manufacturing the Same,", filed Oct. 22, 2013.

U.S. Appl. No. 61/718,884, entitled "Nanowire Sized Opto-electronic Structure and Method for Modifying Selected Portions of Same,", filed Oct. 26, 2012.

U.S. Appl. No. 14/059,658, entitled "Nanowire Sized Opto-electronic Structure and Method for Modifying Selected Portions of Same,", filed Oct. 22, 2013.

International Search Report and Written Opinion received in connection with international application No. PCT/US2013/066165; mailed Feb. 14, 2014.

International Search Report and Written Opinion received in connection with international application No. PCT/US2013/066151; mailed Feb. 17, 2014.

Binari et al., "H, He, and N implant isolation of n-type GaN", J. Appl. Phys. 78, 3008 (1995).

Pearton et al., "Thermal stability of $^2$H-implanted $n$- and $p$-type GaN", Appl. Phys. Lett., 73, 1877 (1998).

Pearton et. al., "Reactivation of acceptors and trapping of hydrogen in GaN/InGaN double heterostructures", Appl. Phys. Lett., 69, 1879 (1996).

International Search Report and Written Opinion received in connection with international application No. PCT/US2013/086129; mailed Mar. 20, 2014.

* cited by examiner

NANOWIRE SIZED OPTO-ELECTRONIC STRUCTURE AND METHOD FOR MODIFYING SELECTED PORTIONS OF SAME

RELATED APPLICATION

This application claims the benefit of priority to U.S. Provisional Application Ser. No. 61/719,133, filed on Oct. 26, 2012, the entire contents of which are incorporated herein by reference.

FIELD

The present invention is directed generally to nanostructures and method of making thereof and specifically to nanowire LEDs and methods of making thereof.

BACKGROUND OF THE INVENTION

Nanostructures are promising building blocks for electronic and optoelectronic semiconductor devices. The three-dimensional shape of the nanostructures can have challenges in device design. Different crystallographic planes can give different growth rate, material composition, and doping.

SUMMARY OF THE INVENTION

In one aspect, the invention provides methods.

In certain embodiments, the invention provides a method for making a LED structure that comprises a support and a plurality of nanowires arrayed on the support, wherein each nanowire comprises a tip and a sidewall, wherein the method comprises reducing or eliminating the conductivity of the tips of the nanowires compared to the conductivity of the sidewalls during or after creation of the nanowires. In certain of these embodiments, conditions during or after creation of the nanowires are controlled such that the conductivity of the tips is reduced by at least one order of magnitude compared to the conductivity of the tips without the controlling of the conditions. In certain embodiments, the controlling of the conditions comprises forming an insulating layer after the creation of the nanowires. In certain embodiments, the insulating layer is formed over the array of nanowires so that insulation is layered on the tips and the sidewalls, then the array is subjected to etching under conditions that removes the insulating layer on the sidewalls but that leaves at least part of the insulating layer on the tips. In certain embodiments, the insulating layer comprises $SiO_x$, such as $SiO_2$. In certain embodiments, the condition that removes the insulating layer on sidewalls but leaves at least part on the tips comprises etching, such as anisotropic etching. In certain embodiments, the nanowires comprise a first conductivity type core and a second conductivity type shell, and the sidewalls and tips comprise the second conductivity type shell. In some of these embodiments, the shell is formed in successive layers such as successive layers of lower conductivity material and higher conductivity material, wherein the higher conductivity material preferentially forms on the sidewalls compared to the tips. In certain of these embodiments, the lower conductivity material comprises p-AlGaN and the higher conductivity material comprises p-GaN. In certain embodiments the shell is formed to provide a plurality of the lower conductivity layers and a plurality of the higher conductivity layers on the sidewalls. In some of these embodiments, the shell is formed to provide only a single lower conductivity layer on the tips. In other embodiments, the shell is formed to provide a plurality of the lower conductivity layers and a plurality of the higher conductivity layers on the tips, wherein the thickness of the higher conductivity layers on the tips is less than that on the sidewalls, such that the tips are less conductive than the sidewalls, such as nonconductive. In certain embodiments where a core and shell are constructed, the method comprises forming a highly resistive material on the tips but not on the sidewalls of the nanowires. In some of these embodiments, the highly resistive material is formed on the tips after the shell is completed. In other of these embodiments, the highly resistive material is formed on the tips before the shell is completed. In certain embodiments, the highly resistive material comprises pGaN that comprises a very high Mg/Ga ratio and a low V/III ratio. In certain embodiments where a core and a shell are constructed, at least one layer of the shell is formed in a carrier gas that comprises $H_2$, such as a carrier gas that comprises at least 50 sccm $H_2$. In certain embodiments, where the nanowires include a core and a shell, the first conductivity type semiconductor nanowire core is enclosed by the second conductivity type semiconductor shell for forming a pn or pin junction that in operation provides an active region for light generation. The first conductivity type may comprise n-type, and the second conductivity type may comprise p-type. In certain embodiments, a support comprises a n-type buffer layer from which the nanowire core is grown during production of the array of nanowires. In certain embodiments, the support further comprises a dielectric masking layer, such that cores protrude from the buffer layer through openings in the masking layer, and the shells are located on the masking layer. In certain embodiments, the support further comprises a substrate layer beneath the buffer layer. In certain embodiments, the substrate layer comprises $Al_2O_3$. In certain embodiments, the support layer further comprises a reflective layer, such as Ag.

In another aspect, the invention provides structures.

In certain embodiments, the invention provides a LED structure comprising a support and a plurality of nanowires arrayed on the support, wherein each of the nanowires comprises a tip and a sidewall, and wherein (i) the nanowires comprise a first conductivity type semiconductor nanowire core and an enclosing second conductivity type semiconductor shell, wherein the core and the shell are configured to form a pn or pin junction that in operation provides an active region for light generation; and (ii) the sidewall comprises a plurality of layers that alternate a lower conductivity layer with a higher conductivity layer, and the tip comprises a single lower conductivity layer or a plurality of layers corresponding to the sidewall layers, wherein the tip layers are thinner than the sidewall layers. In certain embodiments, the sidewall lower conductivity layers comprise p-AlGaN. In certain embodiments, the sidewall higher conductivity layer comprise p-GaN. In certain embodiments, the tip lower conductivity layer comprises p-AlGaN. In certain embodiments, the first conductivity type core is in electrical contact with a buffer layer of the support. In certain embodiments, the second conductivity type shell is insulated from the buffer layer by a mask layer. In certain embodiments, the first conductivity type comprises n-type, the second conductivity type comprises p-type. In certain embodiments, the tip layer or plurality of tip layers is between 10 and 30 nm thick.

In certain embodiments, the invention provides a LED structure comprising a support and a plurality of nanowires arrayed on the support, wherein each of the nanowires comprises a tip and a sidewall, and wherein each of the tips comprises an outer insulating layer that does not extend entirely down the sidewall. In certain embodiments, the insulating layer comprises $SiO_x$. In certain embodiments, the $SiO_x$ comprises $SiO_2$. In certain embodiments, the insulating layer comprises pGaN that comprises a very high Mg/Ga ratio and a low V/III ratio.

DETAILED DESCRIPTION OF THE INVENTION

The invention provides methods for altering the properties of selected areas of nanowire based structures, in particular opto-electronic structures such as LEDs, for example, nanowire light emitting diodes (LEDs), e.g., altering the properties to decrease conductivity of selected portions of nanowires in a nanowire LED. The invention also provides compositions that can be fabricated, e.g., using the methods of the invention.

Figure 1:
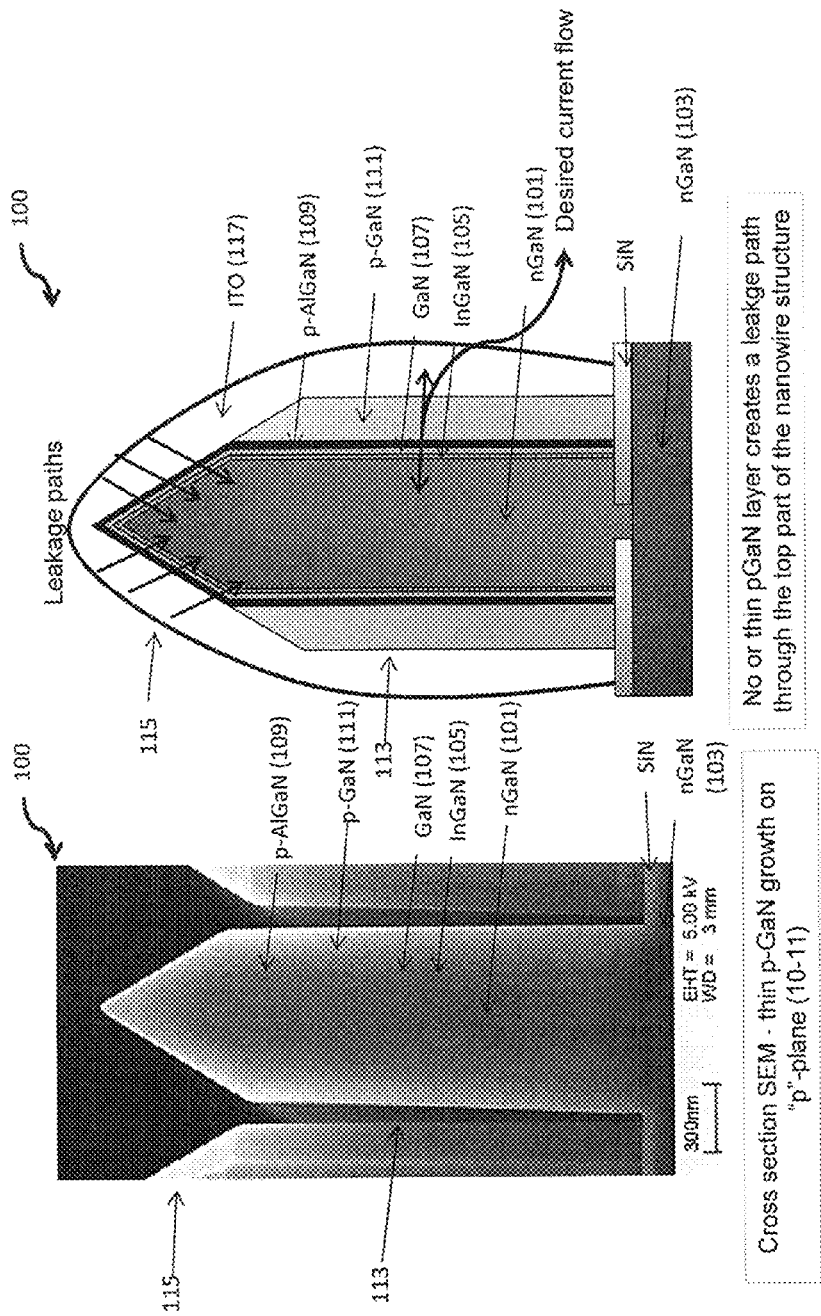
FIGS. 1A and 1B schematically illustrate an exemplary nanowire LED with current leakage.
Figure 2:
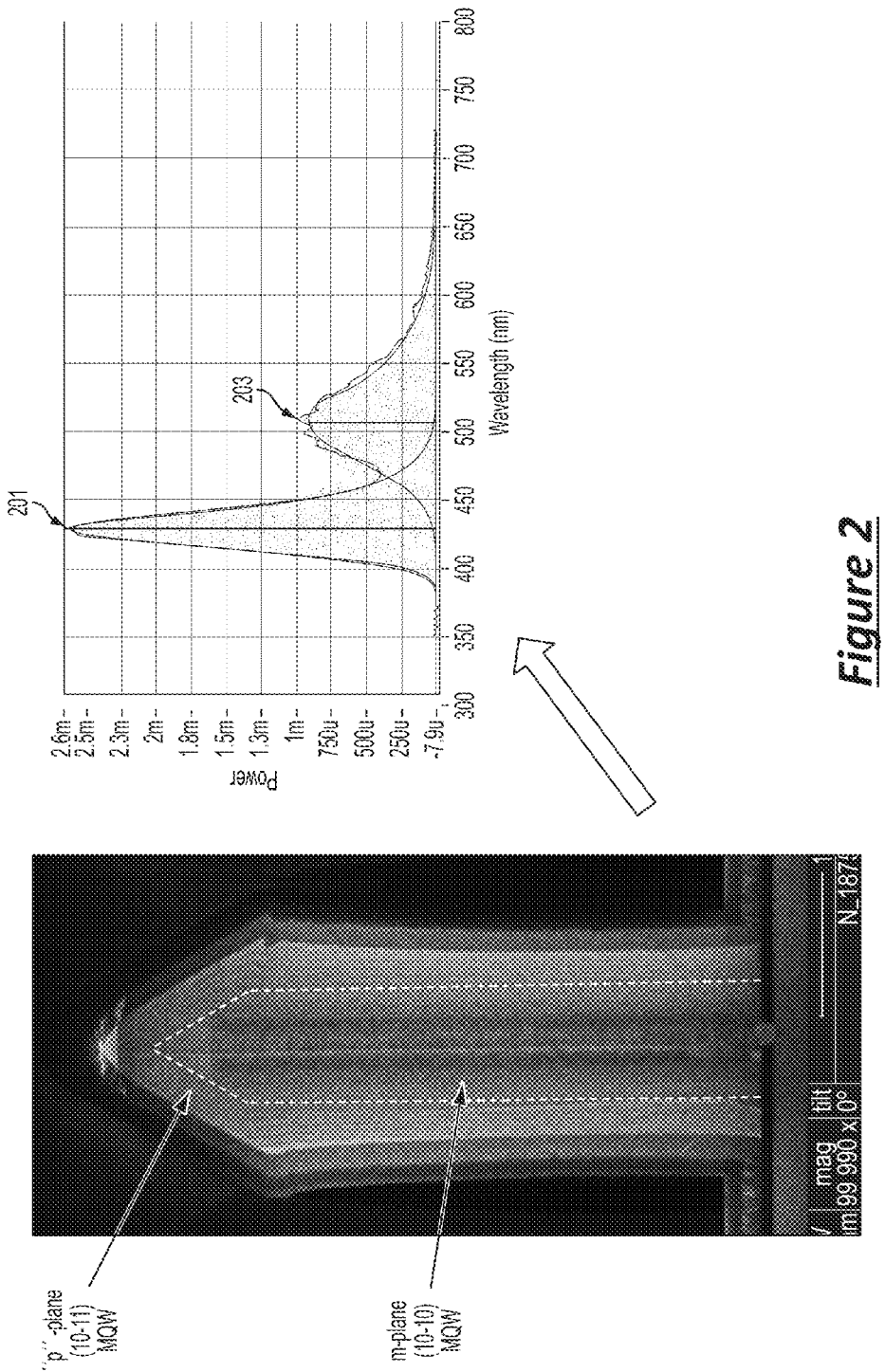
FIG. 2 schematically illustrates an exemplary nanowire LED with multiple emission wavelengths.

The 3-dimensional nature of LEDs made from nanowires emerging from a planar surface can present challenges in device design. Different crystallographic planes can give different growth rates, material composition, and doping. This can, for example, cause leakage paths and multiple emission wavelengths not desirable for the device. An example is a nanowire LED as illustrated in FIG. 1. In this example, a nanowire LED 100 includes a n-GaN core 101 in electrical contact with an n-GaN buffer layer 103, intermediate layers of InGaN 105, GaN 107, and p-AlGaN 109, overlaid with an outer layer of p-GaN 111, with a vertical sidewall 113 and a conical tip 115. There are two growth planes, one on the sidewall 113, 10$\bar{1}$0 region (also referred to as the m-plane herein), and on the tip 115, 10$\bar{1}$1 region (also referred to as the p-plane herein); the p-GaN 111 has a very low growth rate in the 10$\bar{1}$1 region, FIG. 1A. If a contact 117 covers the full nanowire 100, there can be a leak (short circuit) through the thin p-GaN layer 111, FIG. 1B. In addition, as shown in FIG. 2, the unequal distribution of p-GaN can result in multiple emission wavelengths from the LED, as illustrated by the electroluminescence spectra showing two peaks 201, 203 with a shorter wavelength from the m-plane (10-10) and a longer wavelength from the p-plane (10-11).

The methods and compositions of the invention are directed to altering the properties of the 10$\bar{1}$1 region in order to reduce or eliminate current flow through that region; in embodiments of the invention this is achieved by controlling the growth of one or more layers in the 10$\bar{1}$1 region and in other embodiments this is achieved by altering the structure of a finished 10$\bar{1}$1 region.

In certain embodiments of methods provided by the invention, an array of nanowires is grown on a support, where the nanowires comprise a core of a first conductivity type and a shell of a second conductivity type; the nanowires have a tip, e.g., a conical tip (e.g., corresponding to the 10$\bar{1}$1 region, as described above), and sidewalls (e.g., corresponding to the 10$\bar{1}$0, as described above), which may be part of the second conductivity type shell, and where the growth of the shell is controlled so as to produce a tip that has low or substantially no conductivity, so that current leaks through the tip are reduced or eliminated. In some of these embodiments, this is accomplished by growing the shell as multiple successive layers, where a nonconductive or lower conductivity layer is alternated with a higher conductivity layer, under conditions where the higher conductivity layer grows slowly or not at all on the tip, so that the final tip of a nanowire is nonconductive or low conductivity and the sidewalls are conductive. In some of these embodiments, a nonconductive or lower conductivity layer is grown on the tip but not the sidewalls of the nanowire. In some of these embodiments, a gas, e.g., $H_2$, is incorporated into a carrier gas that is used during some parts of the growth of the shell, such that materials are selectively deposited on the sidewall but not the tip, and/or one or more conductive layers (e.g., InGaN) are etched away, allowing the tip to remain nonconductive or low conductivity.

In certain embodiments, a nanowire array that has been grown under conditions that produce a conductive tip in the nanowires is subjected to deposition of an insulating material and optional further treatment so that the insulating material is confined to the tips and the sidewalls remain partially or completely free of the insulating material.

In certain embodiments, some or all of the above methods may be used in combination with deposition of, e.g., insulating or conductive material that is selectively layered on the tips and only partially layered on the sidewalls, through angled travel of the material, to produce desired properties in the LED structure. Angled deposition of materials on nano-electronic arrays, e.g., nanowire LED arrays, is described more fully in U.S. Provisional Patent Application No. 61/718,884 entitled "Nanowire Sized Opto-Electronic Structure and Method for Modifying selected Portions of Same," attorney docket number 9308-017P, filed on Oct. 26, 2012, and hereby incorporated by reference herein in its entirety. In certain embodiments, some or all of the above methods are combined with laser ablation of selected areas and selected structures of the nanoelectronic array, e.g., nanowire LED arrays, to produce areas for, e.g., electrode placement. Laser ablation is described more fully in U.S. Provisional Patent Application No. 61/719,108 entitled "Nanowire LED Structure and Method for Manufacturing the Same," attorney docket number 9308-016P, filed on Oct. 26, 2012, and hereby incorporated by reference herein in its entirety.

In certain embodiments, the invention provides a nanowire LED structure that comprises an array of a plurality of nanowires, each of which has a tip and a sidewall, where the sidewall is multilayered film, comprising layers of higher conductivity (e.g., p-GaN) and layers of lower conductivity (e.g., p-AlGaN), in such a way as to allow conduction of electrons in the multilayer film, and the tip is either a single, nonconductive or lower conductivity layer or multilayered film in such a way as to be nonconductive or lower conductivity than the sidewall.

In certain embodiments, the invention provides a LED structure comprising a support and a plurality of nanowires arrayed on the support, where each of the nanowires comprises a tip and a sidewall, and wherein each of the tips comprises an outer insulating layer that does not extend down the sidewall. In certain embodiments, the invention provides a LED structure comprising a support and a plurality of nanowires arrayed on the support, where each of the nanowires comprises a tip and a sidewall, and wherein each of the tips comprises an outer insulating layer that does not extend down the sidewall more than 1, 2, 3, 4, 5, 7, 10, 15, 20, or 25% of the length of the sidewall, such as extending down 1-25% of the sidewall.

In the art of nanotechnology, nanowires are usually interpreted as nanostructures having a lateral size (e.g., diameter for cylindrical nanowires or width for pyramidal or hexagonal nanowires) of nano-scale or nanometer dimensions, whereas its longitudinal size is unconstrained. Such nanostructures are commonly also referred to as nanowhiskers, one-dimensional nano-elements, nanorods, nanotubes, etc. Generally, nanowires with a polygonal cross section are considered to have at least two dimensions each of which are not greater than 300 nm. However, the nanowires can have a diameter or width of up to about 1 micron. The one dimensional nature of the nanowires provides unique physical, optical and electronic properties. These properties can for example be used to form devices utilizing quantum mechanical effects (e.g., using quantum wires) or to form heterostructures of compositionally different materials that usually cannot be combined due to large lattice mismatch. As the term nanowire implies, the one dimensional nature is often associated with an elongated shape. In other words, "one dimensional" refers to a width or diameter less than 1 micron and a length greater than 1 micron. Since nanowires may have various cross-sectional shapes, the diameter is intended to refer to the effective diameter. By effective diameter, it is meant the average of the major and minor axis of the cross-section of the structure. Although in the figures the nano elements are shown to be pillar like and based on nanowire cores, i.e., more or less "one dimensional" cores, it should be noted that the cores can also have other geometries such as pyramids with various polygonal bases, such as square, hexagonal, octagonal, etc. Thus, as used herein, the core may comprise any suitable nano element having a width or diameter of less than 1 micron and a length greater than 1 micron and may comprise a single structure or a multi-component structure. For example, the core may comprise a semiconductor nanowire of one conductivity type or it may comprise the semiconductor nanowire of one conductivity type surrounded by one or more semiconductor shells of the same conductivity type and the core having a pillar or pyramid shape. For simplicity, a single component nanowire pillar core will be described below and illustrated in the figures.

All references to upper, top, lower, downwards, etc., are made as considering the substrate being at the bottom and the nanowires extending upwards from the substrate. Vertical refers to a direction parallel to the longer extension of the nanowire, and horizontal to a direction parallel to the plane formed by the substrate. This nomenclature is introduced for the ease of understanding only, and should not be considered as limiting to specific assembly orientation etc.

In the methods of the invention, angled direction of a material to a nanowire LED array is used in one or more steps of the methods to selectively alter the properties of certain parts of certain nanowires in the structure while leaving other parts unaltered, e.g., altering the properties of the tips of the nanowires to render them less conductive while leaving the conductivity of part or all of the sidewalls of the nanowires unchanged or substantially unchanged. The material directed to the nanowire array may be, e.g., an insulator, or, e.g., a material that alters the characteristics of selected surfaces of the nanowire, as described more fully herein. The alteration in the conductivity, e.g., decrease in conductivity, of the tips but not the sidewalls or a greater decrease in conductivity of the tip than the sidewall provides for less leakage in the tips and more optimal light production from the nanowire LED array. In certain embodiments, laser ablation of selected portions of the nanowire display may also be used to produce desired results, as described more fully herein.

Any suitable nanowire LED structure as known in the art may be used in the methods of the invention.

Nanowire LEDs are typically based on one or more pn- or p-i-n-junctions. The difference between a pn junction and a p-i-n-junction is that the latter has a wider active region. The wider active region allows for a higher probability of recombination in the i-region. Each nanowire comprises a first conductivity type (e.g., n-type) nanowire core and an enclosing second conductivity type (e.g., p-type) shell for forming a pn or pin junction that in operation provides an active region for light generation. While the first conductivity type of the core is described herein as an n-type semiconductor core and the second conductivity type shell is described herein as a p-type semiconductor shell, it should be understood that their conductivity types may be reversed.

Figure 3:
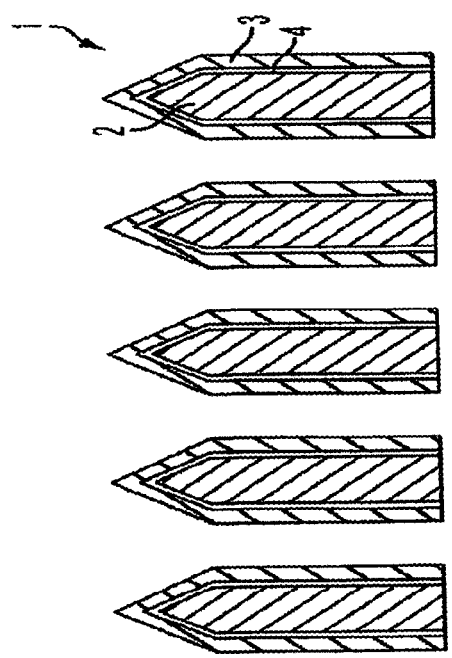
FIG. 3 schematically illustrates a side cross sectional view of a basis of a nanowire LED in accordance with embodiments of the invention.

FIG. 3 schematically illustrates the basis for a nanowire LED structure that is modified in accordance with some embodiments of the invention. In principle, one single nanowire is enough for forming a nanowire LED, but due to the small size, nanowires are preferably arranged in arrays comprising hundreds, thousands, tens of thousands, or more, of nanowires side by side to form the LED structure. For illustrative purposes the individual nanowire LED devices will be described herein as being made up from nanowires 1 having an n-type nanowire core 2 and a p-type shell 3 at least partly enclosing the nanowire core 2 and an intermediate active layer 4. However, for the purpose of embodiments of the invention nanowire LEDs are not limited to this. For example the nanowire core 2, the active layer 4 and the p-type shell 3 may be made up from a multitude of layers or segments. By controlling growth conditions the final geometry of a LED can range from elongated, narrow "pillar structures" to relatively wide based pyramid structures.

In alternative embodiments, only the core 2 may comprise a nanostructure or nanowire by having a width or diameter below 1 micron, while the shell 3 may have a width or diameter above one micron.

For nanowire fabrication, the III-V semiconductors are of particular interest due to their properties facilitating high speed and low power electronics. The nanowires can comprise any semiconductor material, and suitable materials for the nanowire include but are not limited to: GaAs (p), InAs, Ge, ZnO, InN, GaInN, GaN, AlGaInN, BN, InP, InAsP, GaInP, InGaP:Si, InGaP:Zn, GaInAs, AlInP, GaAlInP, GaAlInAsP, GaInSb, InSb, Si. Possible donor dopants for e.g. GaP are Si, Sn, Te, Se, S, etc., and acceptor dopants for the same material are Zn, Fe, Mg, Be, Cd, etc. It should be noted that the nanowire technology makes it possible to use nitrides such as GaN, InN and AlN, which facilitates fabrication of LEDs emitting light in wavelength regions not easily accessible by conventional technique. Other combinations of particular commercial interest include, but are not limited to GaAs, GaInP, GaAlInP, GaP systems. Typical doping levels range from $10^{18}$ to $10^{20}$. A person skilled in the art is though familiar with these and other materials and realizes that other materials and material combinations are possible.

Preferred materials for nanowire LEDs are III-V semiconductors such as a III-nitride semiconductor (e.g., GaN, AlInGaN, AlGaN and InGaN, etc.) or other semiconductors (e.g., InP, GaAs).

In order to function as a LED, the n-side and p-side of each nanowire 1 has to be contacted, and the present invention provides methods and compositions related to contacting the n-side and the p-side of the nanowires in a LED structure.

Although the exemplary fabrication method described herein preferably utilizes a nanowire core to grow semiconductor shell layers on the cores to form a core-shell nanowire, as described for example in U.S. Pat. No. 7,829,443, to Seifert et al., incorporated herein by reference for the teaching of nanowire fabrication methods, it should be noted that the invention is not so limited. For example, in alternative embodiments, only the core may constitute the nanostructure (e.g., nanowire) while the shell may optionally have dimensions which are larger than typical nanowire shells. Furthermore, the device can be shaped to include many facets, and the area ratio between different types of facets may be controlled. This is exemplified in figures by the "pyramid" facets and the vertical sidewall facets. The LEDs can be fabricated so that the emission layer formed on templates with dominant pyramid facets or sidewall facets. The same is true for the contact layer, independent of the shape of the emission layer.

The use of sequential (e.g., shell) layers may result in the final individual device (e.g., a pn or pin device) having a shape anywhere between a pyramid shape (i.e., narrower at the top or tip and wider at the base) and pillar shaped (e.g., about the same width at the tip and base) with circular or hexagonal or other polygonal cross section perpendicular to the long axis of the device. Thus, the individual devices with the completed shells may have various sizes. For example, the sizes may vary, with base widths ranging from 100 nm to several (e.g., 5) μm, such as 100 nm to below 1 micron, and heights ranging from a few 100 nm to several (e.g., 10) μm.

Figure 4:
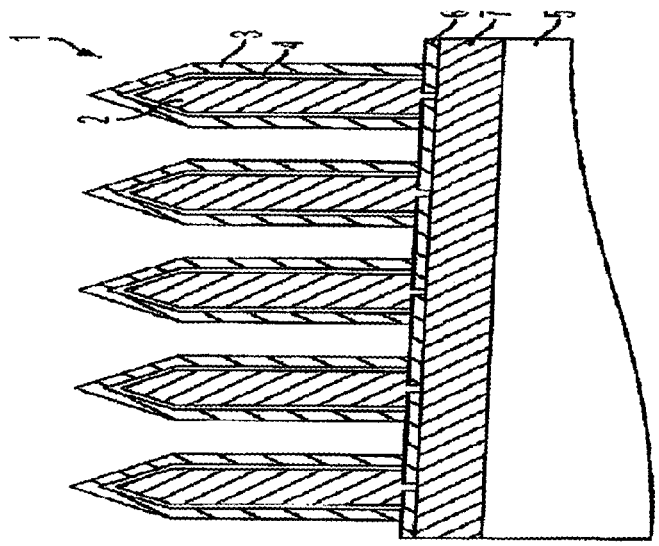
FIG. 4 schematically illustrates a side cross sectional view of a nanowire LED structure on a buffer layer in accordance with embodiments of the invention.

FIG. 4 illustrates an exemplary structure that provides a support for the nanowires. By growing the nanowires 1 on a growth substrate 5, optionally using a growth mask, or dielectric masking layer 6 (e.g., a nitride layer, such as silicon nitride dielectric masking layer) to define the position and determine the bottom interface area of the nanowires 1, the substrate 5 functions as a carrier for the nanowires 1 that protrude from the substrate 5, at least during processing. The bottom interface area of the nanowires comprises the area of the core 2 inside each opening in the dielectric masking layer 6. The substrate 5 may comprise different materials such as III-V or II-VI semiconductors, Si, Ge, $Al_2O_3$, SiC, Quartz, glass, etc., as discussed in Swedish patent application SE 1050700-2 (assigned to GLO AB), which is incorporated by reference herein in its entirety. Other suitable materials for the substrate include, but are not limited to: GaAs, GaP, GaP:Zn, GaAs, InAs, InP, GaN, GaSb, ZnO, InSb, SOI (silicon-on-insulator), CdS, ZnSe, CdTe. In one embodiment, the nanowires 1 are grown directly on the growth substrate 5.

In embodiments in which a dielectric masking (growth mask) layer is used, the growth mask 6 may be patterned by photolithography to define openings for the nanowire growth, as described for example in U.S. Pat. No. 7,829,443, incorporated herein by reference in its entirety. In this implementation, the nanowires are grouped in an n-pad area, a non-active area, a LED area (i.e., the area which emits light) and a p-pad area. However, embodiments of the invention are not limited to this. For example the p-pad area may be arranged on top of the nanowires forming the light emitting part of the nanowire LED structure, whereby the p-pad area and the LED area coincide, as described in PCT International Application Publication Number WO 2010/014032 A1 to Konsek, et al., published Feb. 4, 2010 and incorporated herein by reference in its entirety.

Preferably, the substrate 5 is also adapted to function as a current transport layer connecting to the n-side of each nanowire 1. This can be accomplished by having a substrate 5 that comprises a buffer layer 7 arranged on the surface of the substrate 5 facing the nanowires 1, as shown in FIG. 4, by way of example a III-nitride layer, such as a GaN and/or AlGaN buffer layer 7 on a Si substrate 5. The buffer layer 7 is usually matched to the desired nanowire material, and thus functions as a growth template in the fabrication process. For an n-type core 2, the buffer layer 7 is preferably also doped n-type. The buffer layer 7 may comprise a single layer (e.g., GaN), several sublayers (e.g., GaN and AlGaN) or a graded layer which is graded from high Al content AlGaN to a lower Al content AlGaN or GaN. The nanowires can comprise any semiconductor material, but for nanowire LEDs III-V semiconductors such as a III-nitride semiconductor (e.g., GaN, AlInGaN, AlGaN and InGaN, etc.) or other semiconductors (e.g., InP, GaAs) are usually preferred. The growth of nanowires can be achieved by utilizing methods described in the U.S. Pat. Nos. 7,396,696, 7,335,908, and 7,829,443, and WO201014032, WO2008048704 and WO 2007102781, all of which are incorporated by reference in their entirety herein.

It should be noted that the nanowire 1 may comprise several different materials (e.g., GaN core, InGaN active layer or one or more quantum wells (e.g., multiple quantum well, MQW, active region) and InGaN shell having a different In to Ga ratio than the active layer). In general the substrate 5 and/or the buffer layer 7are referred to herein as a support or a support layer for the nanowires. In certain embodiments, a conductive layer (e.g., a mirror or transparent contact) may be used as a support instead of or in addition to the substrate 5 and/or the buffer layer 7. Thus, the term "support layer" or "support" may include any one or more of these elements.

The buffer layer 7 provides a structure for contacting the n-side of the nanowires 1.

The above description of an exemplary embodiment of a LED structure will serve as a basis for the description of the methods and compositions of the invention; however, it will be appreciated that any suitable nanowire LED structure or other suitable nanowire structure may also be used in the methods and compositions, with any necessary modifications as will be apparent to one of skill in the art, without departing from the invention.

In certain embodiments, the invention provides methods of growing or treating a nanowire LED structure to selectively alter the characteristics of parts of the structure. In certain embodiments, the methods are directed at reducing or eliminating current passage through the tip of a nanowire.

In certain embodiments, the invention provides methods of altering the properties of a selective portion of nanowires in a LED nanowire array. In some of these embodiments, the invention provides a method for constructing a LED structure, where the structure includes a support and a plurality of nanowires arrayed on the support, and where each nanowire comprise a tip and a sidewall, by a method that includes controlling conditions during or after creation of the nanowires to reduce or eliminate the conductivity of the tips of the nanowires compared to the conductivity of the sidewalls. In some embodiments, the conditions are controlled in such a way as to reduce the conductivity of the tips by at least one, two, three, four, or five orders of magnitude compared to the tips constructed without the controlling of the conditions, e.g., constructed as detailed above for a nanowire LED array.

In certain embodiments, the conditions are such that an insulating layer is laid down after the creation of the nanowires. This can be done so that the insulating layer is laid down, e.g., by sputter deposition, to coat the tips and part or all of the sidewalls of the nanowires, then treated to remove, or substantially remove, the insulating layer on the sidewalls but leave at least part of the insulating layer on the tips, e.g., so that the tips remain low conductivity or no conductivity, while the sidewalls retain conductivity. In certain embodiments, less than 20, 15, 10, 7, 5, 4, 3, 2, or 1% (e.g., 0-25%) of the length of the sidewalls retains insulation. The nanowire is subjected to etching under conditions that removes the insulating layer on the sidewalls but that leaves at least part of the insulating layer on the tips. Any suitable insulator may be used. For example, in certain embodiments, $SiO_x$, for example $SiO_2$, may be deposited as the insulating layer. In certain embodiments, the removal of insulating material is accomplished by etching, e.g., by anisotropic etching. The etching may be controlled to remove the desired amount of insulating material, e.g., by controlling the time of etch.

In certain of the embodiments of a method for constructing a LED structure, where the structure includes a support and a plurality of nanowires arrayed on the support, and where each nanowire comprise a tip and a sidewall, by a method that includes controlling conditions during or after creation of the nanowires to reduce or eliminate the conductivity of the tips of the nanowires compared to the conductivity of the sidewalls, the nanowires comprise a first conductivity type core and a second conductivity type shell, and the sidewalls and tips comprise the second conductivity type shell. Materials and techniques for construction of the cores and shells may be, e.g., as detailed herein. In certain embodiments, the shell is laid down as successive layers, for example, successive layers of lower conductivity material and higher conductivity material, e.g., by well-known epitaxial techniques, where the higher conductivity material preferentially layers on the sidewalls compared to the tips. In certain embodiments, the lower conductivity material comprises p-AlGaN and the higher conductivity material comprises p-GaN. The shell may be laid down to provide a plurality of the lower conductivity layers and a plurality of the higher conductivity layers on the sidewalls. In certain embodiments, the shell is laid down (i.e., grown) to provide only a single lower conductivity layer on the tips. In other embodiments, the shell is laid down to provide a plurality of the lower conductivity layers and a plurality of the higher conductivity layers on the tips, wherein the thickness of the higher conductivity layers on the tips is less than that on the sidewalls, such that the tips are less conductive than the sidewalls. The thickness and succession of layers is controlled so that the conductivity of the tip is greatly reduced or eliminated.

In certain embodiments where a core and a shell are constructed, the shell may be constructed so that a highly resistive material is laid down on the tips but not on the sidewalls of the nanowires, or not substantially on the sidewalls of the nanowires. In some of these embodiments, the highly resistive material is laid down on the tips after the shell is completed. In some of these embodiments, the highly resistive material is laid down on the tips before the shell is completed. The highly resistive material may comprise, e.g., pGaN that comprises a very high Mg/Ga ratio and a low V/III ratio. For some embodiments, the preferred V/III ratio is about 10 to about 50 during the growth phase and preferred amount of Mg is about 2% to about 5%, i.e., Mg to Ga ratio in the gas phase. It is well understood that the V/III ratio for typical GaN is greater than 3000 and Mg concentration is less than 1%, i.e., Mg to Ga ratio in the gas phase.

In certain embodiments where a core and a shell are constructed, at least one layer of the shell is laid down in a carrier gas that comprises $H_2$, such as a carrier gas that comprises at least 50, 100, 150, 200, 250, 300, 400, or 500 sccm $H_2$.

In certain embodiments where a core and a shell are constructed, the first conductivity type semiconductor nanowire core is enclosed by the second conductivity type semiconductor shell for forming a pn or pin junction that in operation provides an active region for light generation. In some of these embodiments, the first conductivity type comprises n-type, the second conductivity type comprises p-type.

In certain embodiments where a core and a shell are constructed, and the core comprises an n-type conductivity semiconductor, the support comprises a n-type buffer layer from which the nanowire core is grown during production of the array of nanowires. In some of these embodiments, the support further comprises a dielectric masking layer, such that cores protrude from the buffer layer through openings in the masking layer, and the shells are located on the masking layer. In some embodiments, the support further comprises a substrate layer beneath the buffer layer, such as a substrate layer comprising $Al_2O_3$. In some of these embodiments, the support layer further comprises a reflective layer, such as a reflective layer comprising Ag.

Figure 5:
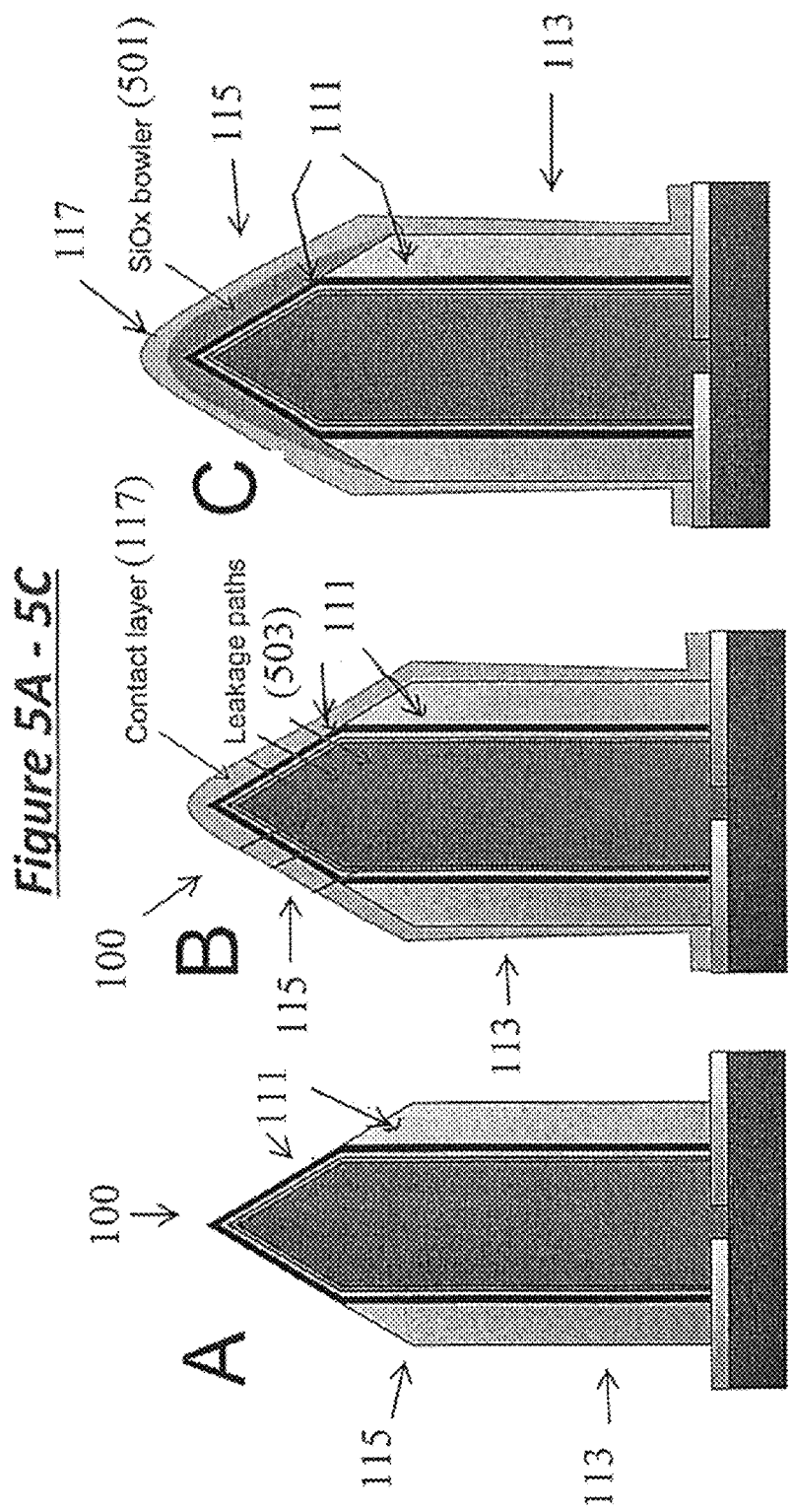
FIGS. 5A-C illustrate one embodiment of the methods and structures of the invention.
Figure 6:
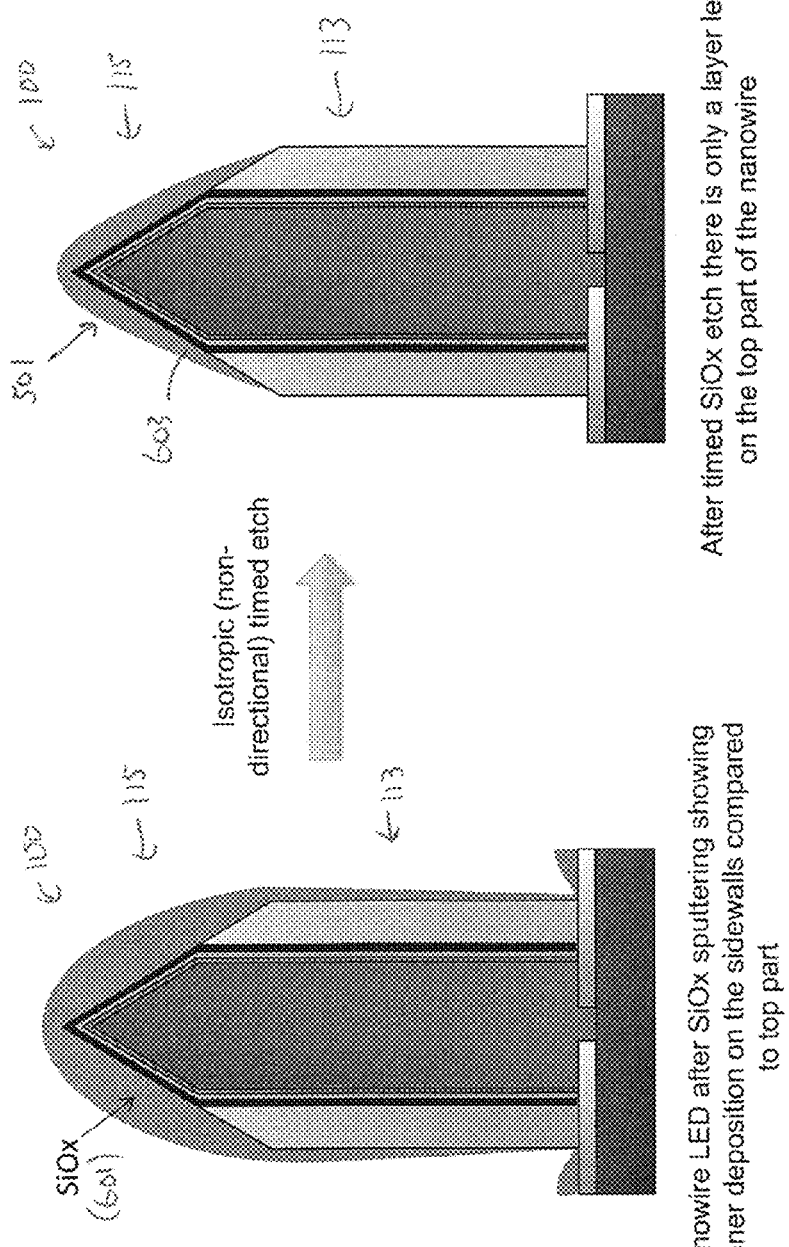
FIG. 6 illustrates one method of reducing current leakage in the tips of nanowires.
Figure 7:
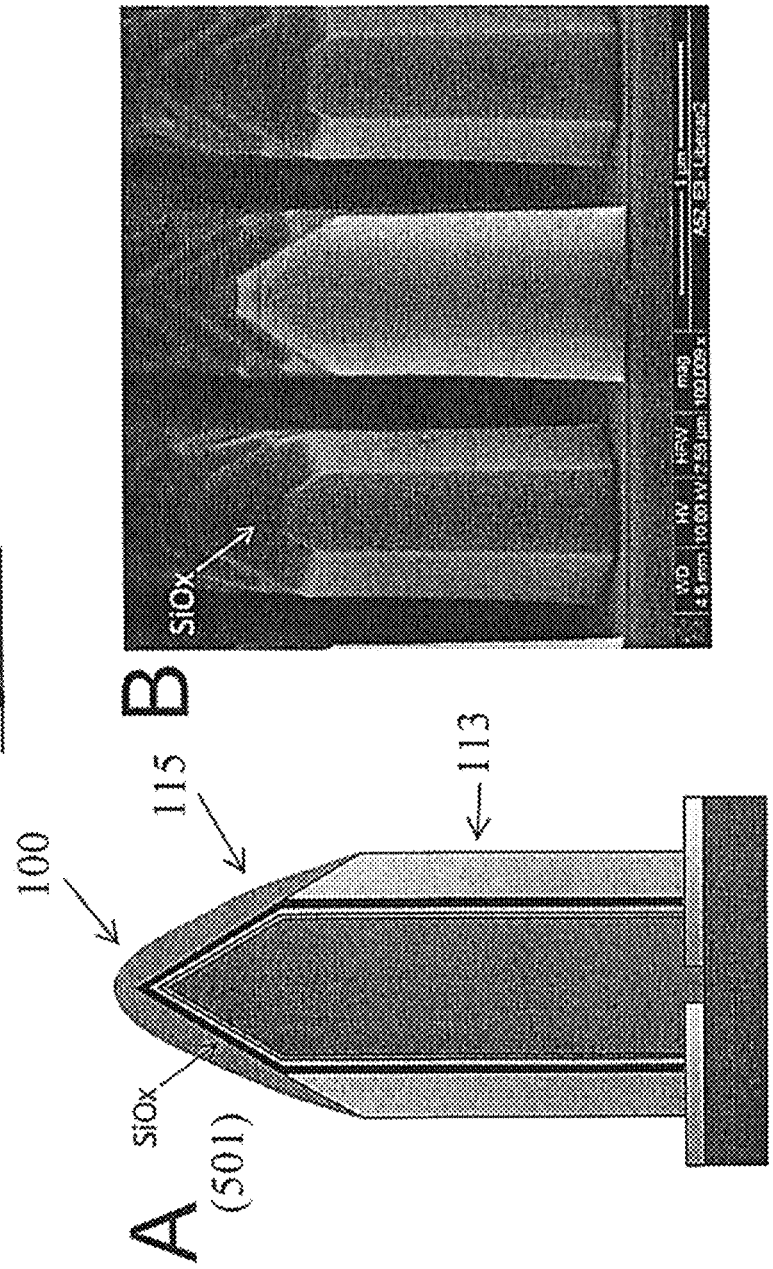
FIGS. 7A and B illustrate nanowire structures with an insulating layer selectively located on the tips of the nanowires.

In one exemplary embodiment as shown in FIGS. 5-7, an insulating layer is created to selectively insulate the 10$\bar{1}$1 plane (p-plane) while leaving the 10$\bar{1}$0 plane unaffected or substantially unaffected. An insulating layer is deposited over a nanowire structure; the insulator may be $SiO_x$ (silicon oxide, e.g., $SiO_2$) or other suitable insulating material, such as $Al_2O_3$, iZnO, SiN, $HfO_2$, or the like, as known in the art. FIG. 5A illustrates an exemplary nanowire (NW) structure 100 with thin pGaN 111 on the 10$\bar{1}$1 plane (p-plane); if a contact layer 117 is deposited on the nanowire, then leakage paths 503 can be located in the 10$\bar{1}$1 plane (p-plane, also referred to as the tip 115 in FIG. 5B). If an insulating layer 501 is deposited on the 10$\bar{1}$1 plane (p-plane) before deposition of the contact layer 117, the leakage routes are reduced or eliminated (FIG. 5C). One method of creating the insulating layer 501 is shown in FIG. 6. A dielectric insulating material 601, e.g., $SiO_x$ such as $SiO_2$, is deposited over the nanowire structure by any suitable method, such as sputter deposit. Because of the high aspect ratio of the nanowires, more insulating material is deposited on the 10$\bar{1}$1 plane (p-plane, corresponding to the tip 115) than on the 10$\bar{1}$0 plane (m-plane, corresponding to the sidewall 113). The insulating layer can then be treated by any suitable method to selectively remove the insulating layer, e.g., any suitable etching method, such as anisotropic (non-directional) etch, and the conditions controlled, e.g., the time of the etch, to allow removal of the insulating layer such that the thinner insulating layer on the sidewalls 113 is removed and the pGaN layer of the 10$\bar{1}$0 plane (m-plane) is re-exposed but the tip 115 is still covered with a remaining portion 603 of the thicker insulating layer 501 (FIG. 6). For a given method and nanowire structure the time of etch that produces optimal results may be determined, e.g., either by calculation or by empirical observation, or both, as known in the art. The result is an insulating layer 501 of, e.g., SiO$_x$ such as SiO$_2$, on the top part of the nanowire, i.e., on the 10$\bar{1}$1 plane (p-plane) with no insulator or lower insulator thickness on the 10$\bar{1}$0 plane (m-plane). FIG. 7A schematically shows the final nanowire product and FIG. 7B is an SEM image of an array of nanowires, where the pGaN on the p-plane is about one half the thickness compared to the m-plane, with insulating SiO$_x$ such as SiO$_2$, on the tips but not the sidewalls of the nanowires.

Figure 8:
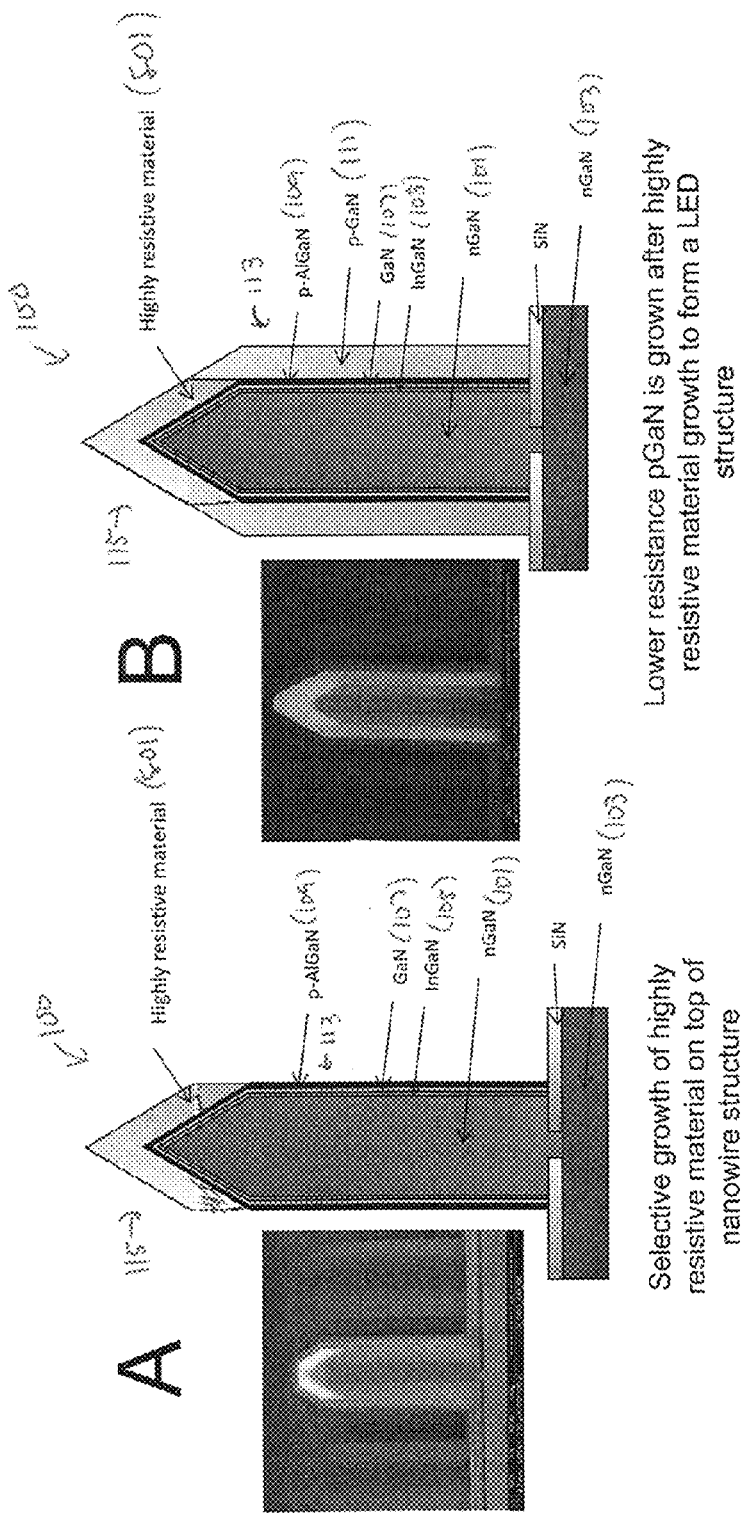
FIGS. 8A and 8B illustrate growth of a highly resistive material at the tip of the nanowire before p-GaN deposition.
Figure 9:
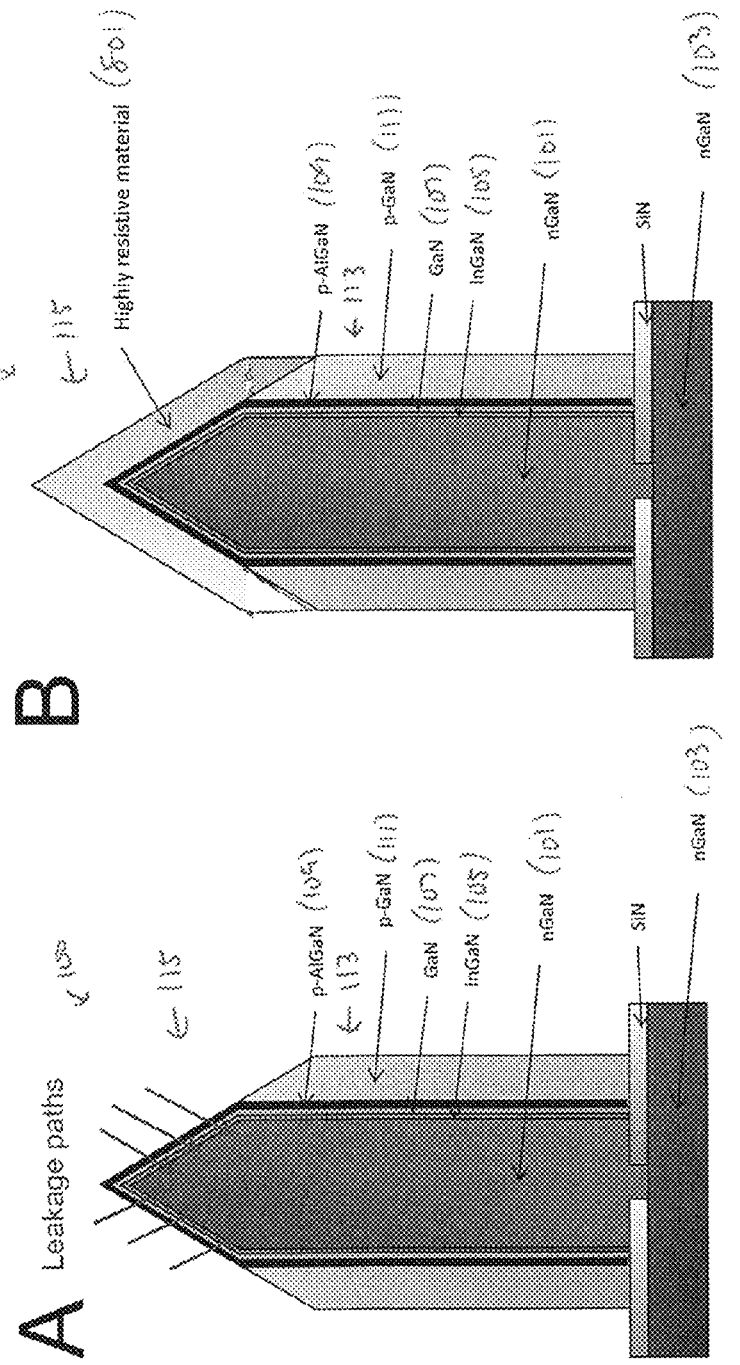
FIGS. 9A and 9B illustrate growth of a highly resistive material at the tip of the nanowire after p-GaN deposition.
Figure 10:
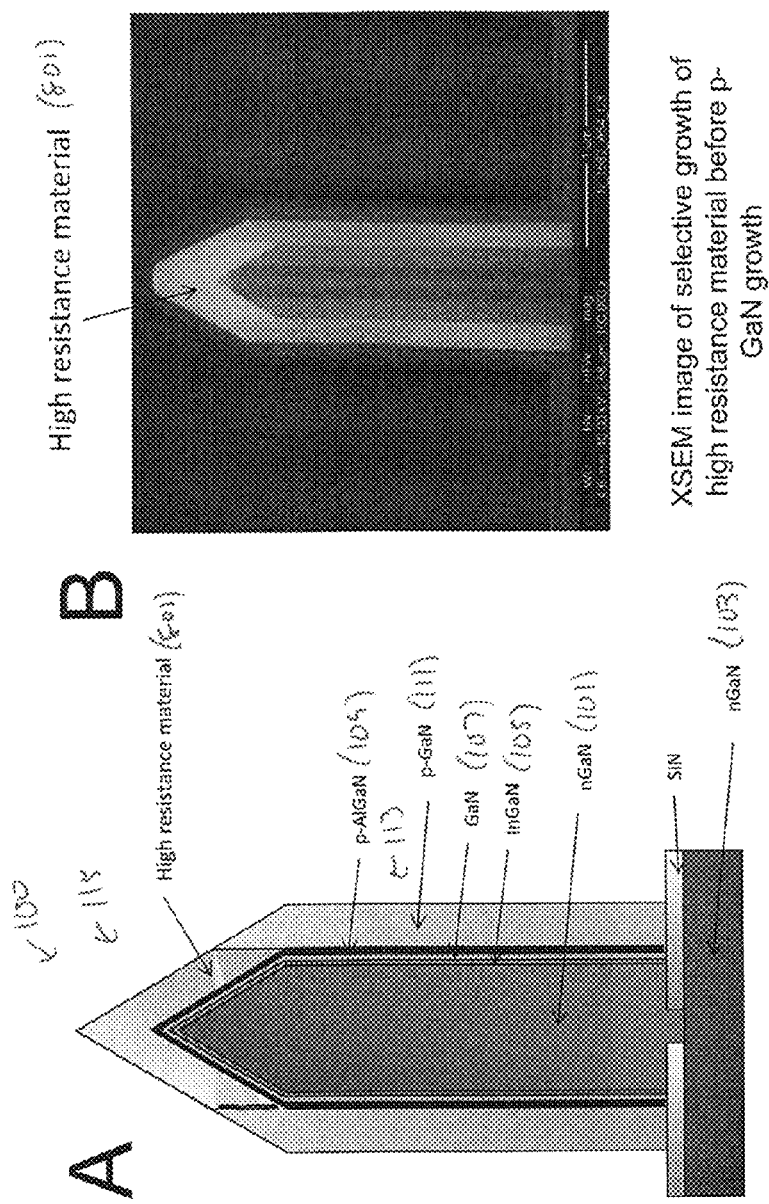
FIGS. 10A and 10B show a highly resistive structure grown on the tip of the nanowire before p-GaN deposition schematically (A) and in XSEM image (B).

In a second exemplary embodiment as shown in FIGS. 8-9, an insulating layer 801 is grown during the growth of the nanowire 100. In this embodiment, a III-nitride material that has significantly higher resistance than pGaN, e.g., pGaN with a very high Mg/Ga ratio and a low V/III ratio during growth (a preferred amount of Mg is about 2% to about 5%, i.e., Mg to Ga ratio in the gas phase and preferred V/III ratio is about 10 to about 50) is selectively grown on the tip 115 compared to the sidewalls 113 during the growth of the nanowire 100. This can be done either before (FIGS. 8A and B) or after (FIGS. 9A and B) pGaN 111 deposition, e.g., by epitaxial deposition. In either case, the result is a high-resistance (e.g., insulating) III-nitride layer 801 selectively located at the top of the nanowires and not extending down the sidewalls 113, or extending only minimally down the sidewalls 113 (e.g., the thickness of this layer 801 is at least two times thicker on the tip 115 than on the sidewalls 113). This layer 801 greatly reduces or eliminates current leakage at the tip 115 of the nanowire, compared to nanowires without the layer 801. A structure 801 grown before pGaN deposition is shown schematically in FIG. 10A and in XSEM image in FIG. 10B.

Figure 11:
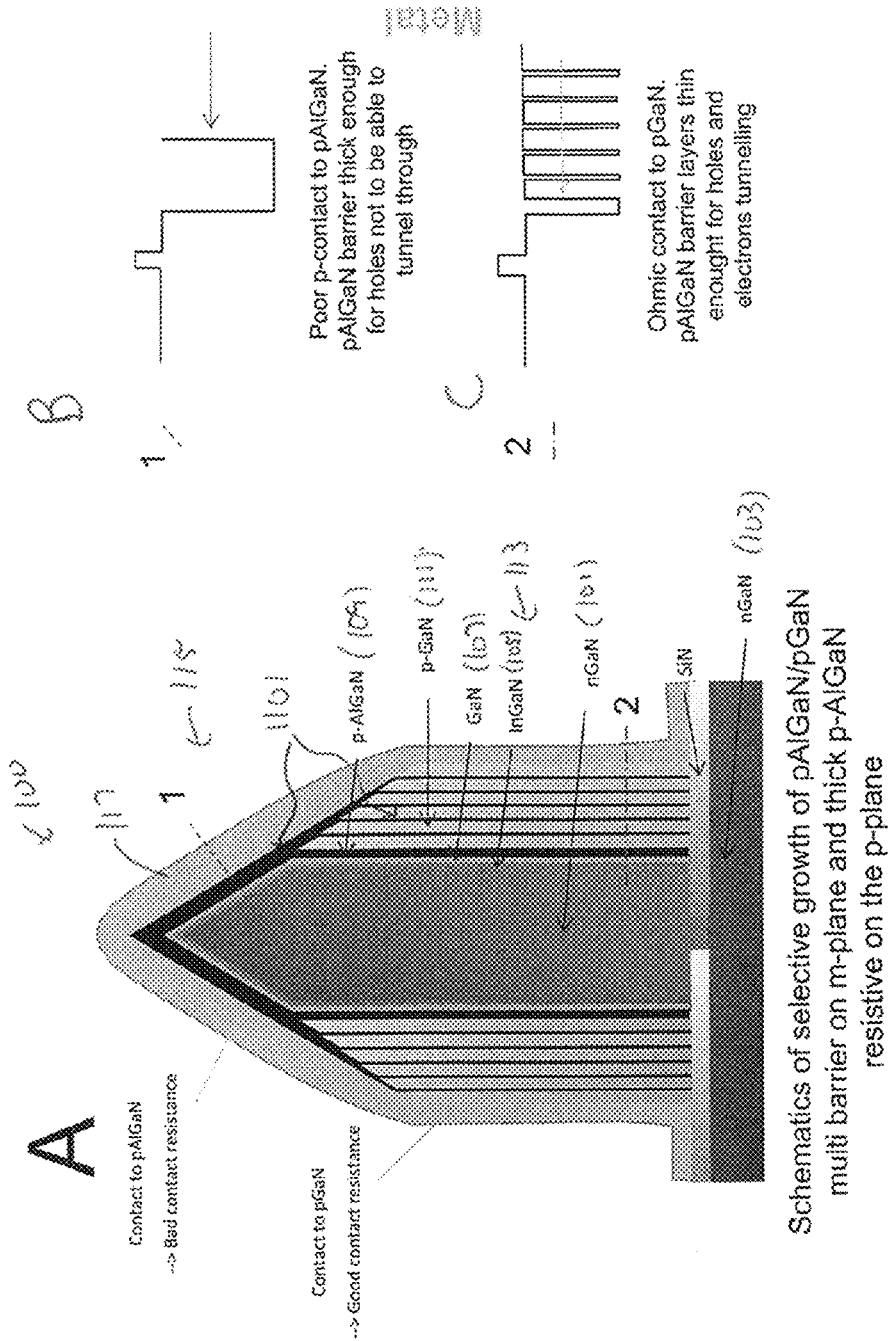
FIGS. 11A-C illustrate a nanowire structure with multiple layers laid down successively so that the sidewalls are multi-layer and the tip is a single layer, and electron conductance through the tip and sidewall.
Figure 12:
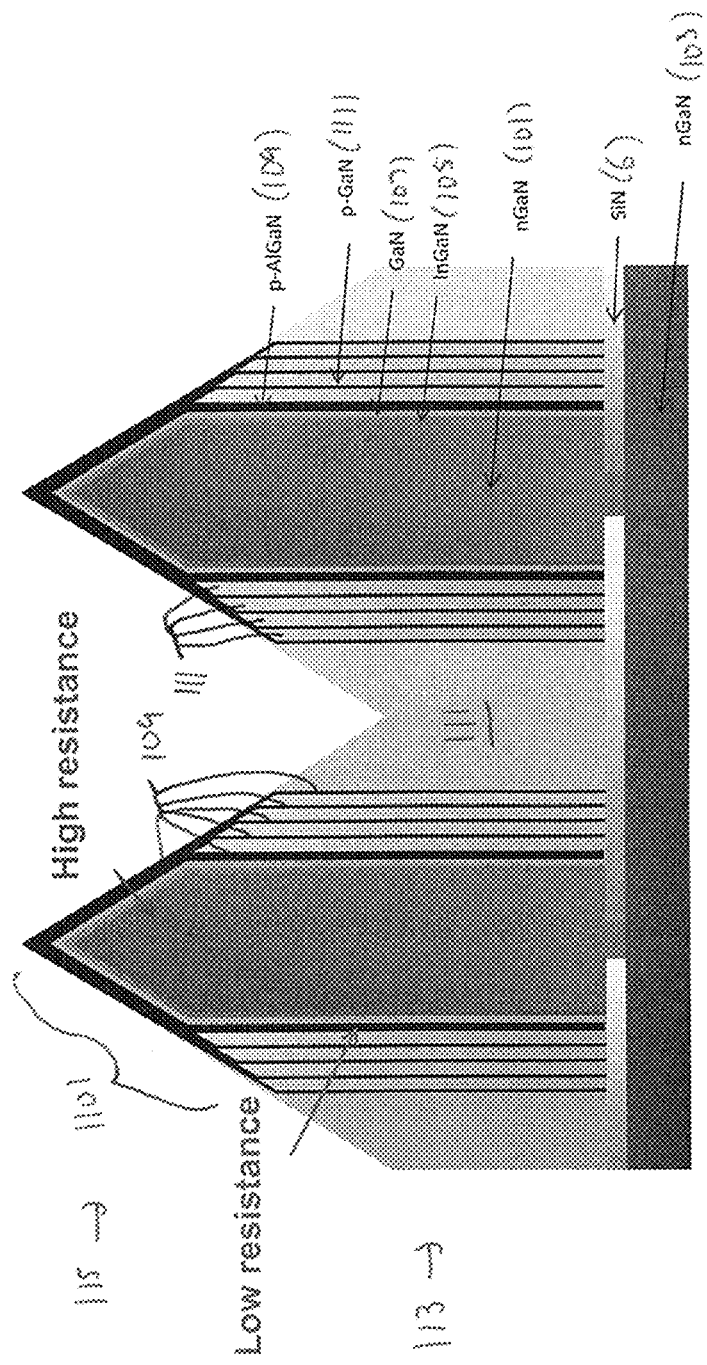
FIG. 12 illustrates a multilayer nanowire structure with coalesced conductive layer.
Figure 13:
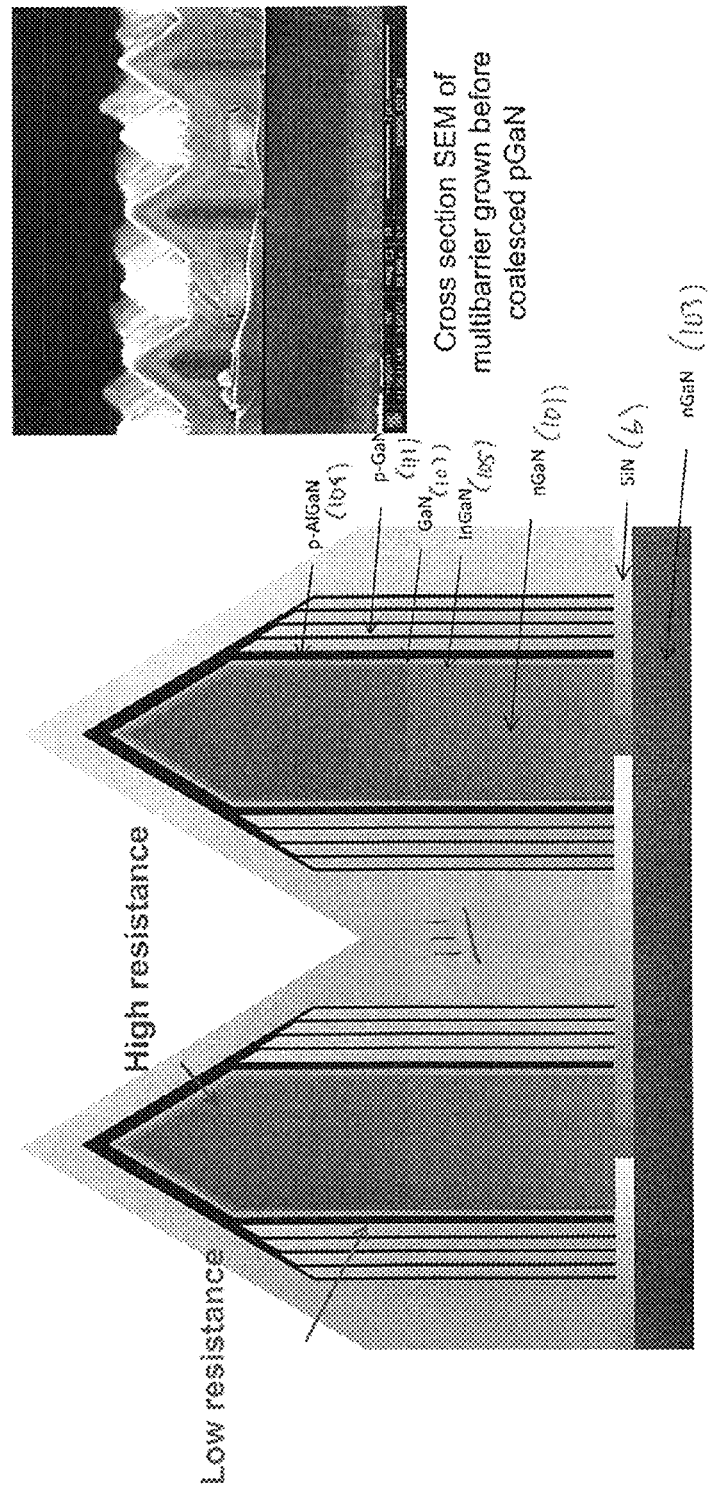
FIG. 13 illustrates a multilayer nanowire structure with coalesced p-GaN structure.

In a third exemplary embodiment as shown in FIGS. 11-13, successive layers are deposited during the growth of the nanowire, and the successive layering changes the conductivity on the tip compared to a nanowire grown without successive layering. Without being bound by theory, it is thought that pGaN grows more slowly in the 10$\bar{1}$1 region (the p-plane) compared to the 10$\bar{1}$0 region (the m-plane), but pAlGaN grows at the same rate on both planes. By growing a multilayer structure, e.g., of 2 nm pAlGaN/10 nm pGaN on the 10$\bar{1}$0 region (the m-plane), the 10$\bar{1}$1 region (the p-plane) will end up with a thick pAlGaN layer with no or very thin pGaN layer in between. The barriers are grown such that the holes and electrons are easily tunneling through the pAlGaN on the 10$\bar{1}$0 region (the m-plane) but the combined pAlGaN layers form a barrier to electron travel on the 10$\bar{1}$1 region (the p-plane). In addition, if a contact is placed on this structure, there will be poor contact on the 10$\bar{1}$1 region (the p-plane) pAlGaN, which is known to make poor contact, and good contact with the pGaN on the 10$\bar{1}$0 region (the m-plane). The multilayer structure 1101 is illustrated in FIG. 11A with a conductive layer 117 over the entire structure 100, and electron movement from the conductive layer 117 to the pGaN layer 101 of the nanowire is illustrated FIG. 11B, which shows that at the tip 115, there is poor contact to the pAlGaN 109 and the combined pAlGaN layer 109 is thick enough that electrons cannot tunnel through, thus leakage (current) is reduced or eliminated in the tip, compared to the layer on the sidewall 113 (FIG. 11C), which shows that there is Ohmic contact to the pGaN 111 and that the pAlGaN 109 layers separating the thicker pGaN layers 111 are thin enough for holes and electron tunneling (i.e., good conductance and current). The contact and conductivity properties are theoretical and it will be appreciated that the invention is directed to successive deposition that leads to greatly reduced conductance at the tip 115 compared to the sidewalls 113 of the nanowire, no matter what the mechanism. The conductive layer 1101 is further illustrated in FIGS. 12 and 13, which illustrate coalesced growth of pGaN 111 to provide an easier contact deposition. FIG. 12 shows a multilayer 1101 nanowire structure before coalesced pGaN deposition and FIG. 13 shows the multilayer structure after coalesced pGaN deposition. Methods for such deposition are described in, e.g., U.S. application Ser. No. 13/245,405, filed Sep. 26, 2011 and PCT Patent Application PCT/US12/51081 entitled "Coalesced Nanowire Structures With Interstitial Voids and Method for Manufacturing Same," filed Sep. 26, 2011, which are both incorporated herein by reference in their entirety. Briefly, a first conductivity type semiconductor nanowire core is grown from portions of a semiconductor surface of a support exposed through openings in an insulating mask layer on the support, forming semiconductor active region shells on the cores, growing a continuous second conductivity type semiconductor layer extending over and around the cores and the shells, such that a plurality of interstitial voids are formed in the second conductivity type semiconductor layer extending between the cores during the step of growing, and forming a first electrode layer that contacts the second conductivity type semiconductor layer and extends into the interstitial voids.

Figure 14:
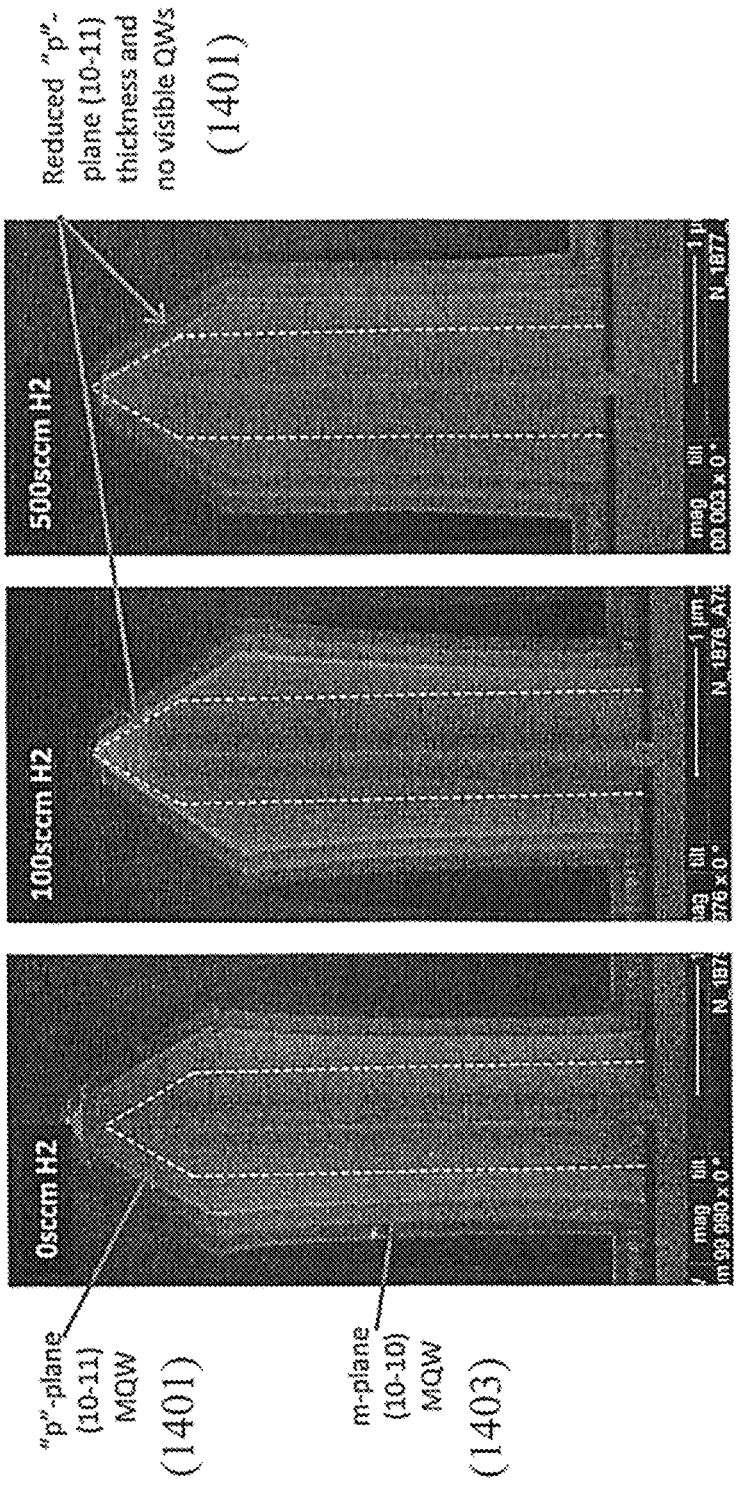
FIG. 14 illustrates electron micrographs of nanowire structures created with 0, 100, and 500 sccm $H_2$ in carrier gas.

A fourth exemplary embodiment as shown in FIG. 14. In this embodiment, a fraction of the carrier gas for GaN barrier growth in the MQW active region is H$_2$ (e.g., H$_2$ is used in addition to an inert MOCVD carrier gas). It has been observed that using H$_2$ as a fraction of carrier gas for GaN barrier growth in a MQW active region will drastically reduce the growth rate of the MQW active region on the 10$\bar{1}$1 region (the p-plane) (indicated by 1401 in FIG. 14) but will remain the same on the 10$\bar{1}$0 region (the m-plane) (indicated by 1403 in FIG. 14). Using H$_2$ in the GaN barrier it is possible to achieve an m-plane only device having InGaN light-emitting layer (e.g., MQW active region) selectively deposited on the m-plane but not on the p-plane. FIG. 14 illustrates the effects of various concentrations of H$_2$ in the carrier gas, with a drastically reduced p-plane thickness and no quantum wells 1401 observed with both 100 standard cubic centimeters per minute (sccm) and 500 sccm H$_2$ in the carrier gas. In addition, there is little or no InGaN (which is not grown with H$_2$ carrier gas) on the p-plane, which was presumably etched by the H$_2$ carrier gas during GaN deposition.

Further processing, such as laser ablation, laying down of a contact, and the like may be performed, for example as described in U.S. Provisional Patent Application No. 61/719, 108 entitled "Nanowire LED Structure and Method for Manufacturing the Same, attorney docket number 9308-016P, filed on Oct. 26, 2012, and hereby incorporated by reference herein in its entirety. For example, after nanowires are formed or treated to decrease conductivity of the tips, an electrode layer, e.g., a transparent conductive oxide (TCO), such as ITO, may be deposited over the structure by any suitable method, e.g., sputter deposition, to make electrical contact with the p-GaN sidewalls of the nanowires that have not been coated with the insulating material and provide a p-electrode. Laser ablation may be performed to expose the nGaN buffer layer in certain areas and an N-side metal contact laid down on the exposed buffer layer to provide an n-electrode. The insulating layer on top of the nanowires acts to prevent or greatly reduce current leakage through the tips of the nanowires so that current is directed to the exposed areas of the sidewalls. This is merely exemplary, and any suitable method of forming electrical contact with the pGaN and nGaN layers may be used.

A nanowire LED is intended to either emit light from the top of the nanowire, e.g., through the p-electrode, or from the bottom of the nanowire, e.g., through the support layer (e.g., through the conductive layer and/or buffer layer and/or substrate) and this has to be taken into account when choosing the contact materials. As used herein, the term light emission includes both visible light (e.g., blue or violet light) as well as UV or IR radiation. For a top emitting nanowire LED, as described in the above example, the top contact material needs to be transparent, e.g., ITO. A reflective layer, such as silver or aluminum, as described below, may make up part of the support. In the case of a bottom emitting nanowire LED, the top contact material can be a reflecting layer like silver or aluminum, as described below. In general the construction of a bottom emitting nanostructure entails providing reflective structure, such as a mirror, at or near i.e. adjacent the top portions of each individual light emitting nanoelement so as to direct the emitted light backwards through the buffer layer of the device. Bottom-emitting electrodes are described further in U.S. Patent Publication No. 2011/0309382, filed on Jun. 17, 2011 and PCT Application No. PCT/US11/40932, filed Jun. 17, 2011, both of which are incorporated herein by reference in their entirety.

Silver, among the metals, has the best reflection coefficient in the visible region of the optical spectra, but is more prone to exhibit corrosion damage in normal atmosphere if not capped inside a structure. $Si_3N_4$, $SiO_2$, $Al_2O_3$ or any other stable dielectric can be used as a capping layer. Aluminum has a reflective index in the visible region somewhat lower than silver, but exhibits very good corrosion resistance in dry atmospheric environments. In order to improve device reliability additional dielectric capping as described above may still be desired. In the case of a transparent top contact layer, Indium Tin Oxide (ITO), as described, or other transparent compounds or highly doped semiconductors having high electrical conductivity and transmittance may be used.

Although the present invention is described in terms of altering the properties of selected portions of nanowire LEDs, it should be appreciated that other nanowire based semiconductor devices, such as field-effect transistors, diodes and, in particular, devices involving light absorption or light generation, such as, photodetectors, solar cells, lasers, etc., can be contacted in the same way, and in particular the angled alteration method can be implemented on any nanowire structures.

The invention also provides LED structures.

In certain embodiments, the invention provides a LED structure comprising a support and a plurality of nanowires arrayed on the support, where each of the nanowires comprises a tip and a sidewall, and where (i) the nanowires comprise a first conductivity type semiconductor nanowire core and an enclosing second conductivity type semiconductor shell, wherein the core and the shell are configured to form a pn or pin junction that in operation provides an active region for light generation; and (ii) the sidewall comprises a plurality of layers that alternate a lower conductivity layer with a higher conductivity layer, and the tip comprises a single lower conductivity layer or a plurality of layers corresponding to the sidewall layers, wherein the tip layers are thinner than the sidewall layers. In certain embodiments, the sidewall lower conductivity layers comprise p-AlGaN. In certain embodiments, the sidewall higher conductivity layer comprise p-GaN. In some of these embodiments, the tip lower conductivity layer comprises p-AlGaN. The first conductivity type core may be in electrical contact with a buffer layer of the support. The second conductivity type shell may be insulated from the buffer layer by a mask layer. In certain embodiments, the first conductivity type comprises n-type, such as nGaN, and the second conductivity type comprises p-type, such as p-GaN. In certain embodiments, the tip layer or plurality of tip layers is between 5 and 50 nm, for example between 5 and 40, such as between 10 and 40, e.g., between 10 and 30 nm thick.

In certain embodiments, the invention provides a LED structure comprising a support and a plurality of nanowires arrayed on the support, where each of the nanowires comprises a tip and a sidewall, and wherein each of the tips comprises an outer insulating layer that does not extend down the sidewall, or extends no more than 1, 2, 3, 4, 5, 7, 10, 13, 15, 20, 30, or 40% down the sidewall's length, e.g., no more than 5%. In certain embodiments, the insulating layer comprises $SiO_x$, such as $SiO_2$. In certain embodiments, the insulating layer comprises pGaN that comprises a very high Mg/Ga ratio and a low V/III ratio (preferred V/III ratio is about 10 to about 50 and preferred amount of Mg is about 2% to about 5%).

Though the embodiments have been described in terms of altering the properties of the selected parts of the LED nanowires to render them less conductive, it will be appreciated that similar techniques may be used to render certain parts of LED nanowires more conductive, e.g., conductive materials may be deposited to selectively contact the sidewalls, but not the tips, of nanowires.

In particular, it should be emphasized that although the figures illustrate embodiments having a pillar like geometry and are based on nano wire core, i.e. "one dimensional" cores, it should be understood that the cores can have other geometries such as pyramidal shapes by changing growth conditions. Also, by changing growth conditions, the final nano element can have a pyramidal shape, or any shape between a pillar like and a pyramid shape.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

The invention claimed is:

1. A method of making a LED structure that comprises a support and a plurality of nanowires located on the support, wherein each nanowire comprises a tip and a sidewall, wherein the method comprises reducing or eliminating the conductivity of the tips of the nanowires compared to the conductivity of the sidewalls during or after creation of the nanowires;

further comprising controlling nanowire growth conditions such that conductivity of the tips is reduced by at least one order of magnitude compared to the conductivity of the tips without the controlling of nanowire growth conditions;

wherein reducing or eliminating the conductivity of the tips comprises forming an insulating layer over the nanowires after the creation of the nanowires, wherein the insulating layer is formed over an array of nanowires so that the insulating layer is layered on the tips and the sidewalls, then the array is subjected to etching under conditions that removes all or part of the insulating layer on the sidewalls but that leaves at least a larger thickness part of the insulating layer on the tips, and the insulating layer comprises SiOx.

2. The method of claim 1 wherein at least one of:
(a) the SiOx comprises SiO2;

(b) the formed insulating layer has a larger thickness on the tips than on the sidewalls; and (c) the etching comprises anisotropic etching.

3. A method of making a LED structure that comprises a support and a plurality of nanowires located on the support, wherein each nanowire comprises a tip and a sidewall, wherein the method comprises reducing or eliminating the conductivity of the tips of the nanowires compared to the conductivity of the sidewalls during or after creation of the nanowires;

further comprising controlling nanowire growth conditions such that conductivity of the tips is reduced by at least one order of magnitude compared to the conductivity of the tips without the controlling of nanowire growth conditions;

wherein the nanowires comprise a first conductivity type semiconductor core and a second conductivity type semiconductor shell, and the sidewalls and tips comprise the second conductivity type semiconductor shell formed as successive layers of lower conductivity material and higher conductivity material, wherein the higher conductivity material preferentially forms on the sidewalls compared to the tips.

4. The method of claim 3 further comprising forming a highly resistive material on the tips but not on the sidewalls of the nanowires.

5. The method of claim 4 wherein the highly resistive material is selectively formed on the tips after the shell is completed.

6. The method of claim 4 wherein the highly resistive material is selectively formed on the tips before the shell is completed.

7. The method of claim 6 wherein the highly resistive material comprises pGaN that comprises 2-5% Mg and is grown by MOCVD using a V/III ratio of 10-50.

8. The method of claim 3 wherein the first conductivity type semiconductor nanowire core is enclosed by the second conductivity type semiconductor shell for forming a pn or pin junction that in operation provides an active region for light generation, wherein the first conductivity type comprises n-type, the second conductivity type comprises p-type.

9. The method of claim 3 wherein the nanowire core is grown during production of the array of nanowires from a support that comprises an n-type buffer layer, wherein the support further comprises a dielectric masking layer, such that cores protrude from the buffer layer through openings in the masking layer, and the shells are located on the masking layer.

10. The method of claim 9 wherein at least one of:

(a) the support further comprises a substrate layer beneath the buffer layer and the substrate layer comprises $Al_2O_3$; and (b) the support further comprises a reflective layer and the reflective layer comprises Ag.

11. A method of making a LED structure that comprises a support and a plurality of nanowires located on the support, wherein each nanowire comprises a tip and a sidewall, wherein the method comprises reducing or eliminating the conductivity of the tips of the nanowires compared to the conductivity of the sidewalls during or after creation of the nanowires, the nanowires comprise a first conductivity type semiconductor core and a second conductivity type semiconductor shell, and the sidewalls and tips comprise the second conductivity type semiconductor shell formed as successive layers of lower conductivity material and higher conductivity material, wherein the higher conductivity material preferentially forms on the sidewalls compared to the tips wherein at least one of:

(a) the lower conductivity material comprises p-AlGaN and the higher conductivity material comprises p-GaN;

(b) the shell is formed to provide a plurality of the lower conductivity layers and a plurality of the higher conductivity layers on the sidewalls;

(c) the shell is formed to provide only a combined lower conductivity layer comprised of multiple films of the lower conductivity material on the tips;

(d) the shell is formed to provide a plurality of the lower conductivity layers and a plurality of the higher conductivity layers on the tips, wherein the thickness of the higher conductivity layers on the tips is less than that on the sidewalls, such that the tips are less conductive than the sidewalls; and (e) the tips are nonconductive.

12. The method of claim 11 wherein: (a) the lower conductivity material comprises p-AlGaN and the higher conductivity material comprises p-GaN.

13. The method of claim 11 wherein: (b) the shell is formed to provide the plurality of the lower conductivity layers and the plurality of the higher conductivity layers on the sidewalls.

14. The method of claim 11 wherein: (c) the shell is formed to provide only the combined lower conductivity layer comprised of multiple films of the lower conductivity material on the tips.

15. The method of claim 11 wherein: (d) the shell is formed to provide the plurality of the lower conductivity layers and the plurality of the higher conductivity layers on the tips, wherein the thickness of the higher conductivity layers on the tips is less than that on the sidewalls, such that the tips are less conductive than the sidewalls.

16. The method of claim 11 wherein: (e) the tips are nonconductive.

* * * * *